United States Patent
Aruga

(10) Patent No.: US 12,421,359 B2
(45) Date of Patent: Sep. 23, 2025

(54) FILM

(71) Applicant: AGC INC., Tokyo (JP)

(72) Inventor: Hiroshi Aruga, Chiyoda-ku (JP)

(73) Assignee: AGC INC., Tokyo (JP)

( * ) Notice: Subject to any disclaimer, the term of this patent is extended or adjusted under 35 U.S.C. 154(b) by 269 days.

(21) Appl. No.: 18/146,604

(22) Filed: Dec. 27, 2022

(65) Prior Publication Data

US 2023/0126996 A1 Apr. 27, 2023

Related U.S. Application Data

(63) Continuation of application No. PCT/JP2021/022558, filed on Jun. 14, 2021.

(30) Foreign Application Priority Data

Jun. 30, 2020 (JP) .................. 2020-112390

(51) Int. Cl.
| | |
|---|---|
| C08J 5/18 | (2006.01) |
| C08K 3/04 | (2006.01) |
| C08K 3/22 | (2006.01) |
| C08K 5/3417 | (2006.01) |
| C23C 14/08 | (2006.01) |

(Continued)

(52) U.S. Cl.
CPC .............. *C08J 5/18* (2013.01); *C08K 3/04* (2013.01); *C08K 3/22* (2013.01); *C08K 5/3417* (2013.01); *C23C 14/081* (2013.01); *C23C 14/205* (2013.01); *C23C 14/34* (2013.01); *C08J 2323/08* (2013.01); *C08J 2483/04* (2013.01);

(Continued)

(58) Field of Classification Search
CPC ...... B32B 27/20; B32B 27/30; C08J 2323/08; C08J 2327/18; C08J 2427/12; C08J 2483/04; C08J 5/18; C08J 7/0423; C08J 7/06; C08K 2003/0862; C08K 2003/0893; C08K 2003/2237; C08K 2003/2251; C08K 2003/2262; C08K 2003/2265; C08K 2003/2289; C08K 2201/014; C08K 3/013; C08K 3/04; C08K 3/08; C08K 3/22; C08K 5/0041; C08K 5/0091; C08K 5/3417; C08L 27/12; C08L 27/18; C08L 83/04; C23C 14/081; C23C 14/205; C23C 14/34; E04H 15/54; Y02A 40/25
See application file for complete search history.

(56) References Cited

U.S. PATENT DOCUMENTS

2009/0263650 A1   10/2009   Aruga
2017/0044375 A1*  2/2017   Kitao ............ C09D 167/00
(Continued)

FOREIGN PATENT DOCUMENTS

CN   103131228 A   6/2013
CN   104093781 A   10/2014
(Continued)

OTHER PUBLICATIONS

International Search Report issued Aug. 31, 2021 in PCT/JP2021/022558 filed on Jun. 14, 2021, 2 pages.

*Primary Examiner* — Lawrence D Ferguson
(74) *Attorney, Agent, or Firm* — Oblon, McClelland, Maier &Neustadt, L.L.P.

(57) ABSTRACT

A film contains a fluororesin, a chromatic pigment, and a black pigment, in which a visible light transmittance of the film is from 5 to 60% and a haze value of the film is 30% or less.

17 Claims, 1 Drawing Sheet

(51) Int. Cl.
*C23C 14/20* (2006.01)
*C23C 14/34* (2006.01)

(52) U.S. Cl.
CPC ................ *C08K 2003/2289* (2013.01); *C08K 2201/014* (2013.01)

(56) References Cited

U.S. PATENT DOCUMENTS

2018/0004078 A1 1/2018 Higuchi et al.
2020/0009893 A1 1/2020 Aruga

FOREIGN PATENT DOCUMENTS

| | | |
|---|---|---|
| JP | 3623008 B2 | 2/2005 |
| JP | 5365195 B2 | 12/2013 |
| JP | 2015-232629 A | 12/2015 |
| WO | WO 2016/199867 A1 | 12/2016 |
| WO | WO 2018/181214 A1 | 10/2018 |

\* cited by examiner

FILM

CROSS-REFERENCE TO RELATED APPLICATIONS

This application is a Continuation of International Application No. PCT/JP2021/022558, filed on Jun. 14, 2021, which claims priority to Japanese Patent Application No. 2020-112390, filed on Jun. 30, 2020. The entire disclosure of each of the above applications is incorporated herein by reference.

TECHNICAL FIELD

The present invention relates to a film.

BACKGROUND ART

Due to excellent weather resistance and stain resistance, fluororesin films are used as membrane materials (roofing materials, exterior wall materials, or the like) in membrane structures such as sports facilities (swimming pools, gymnasiums, tennis courts, soccer fields, athletic fields, and the like), warehouses, assembly halls, exhibition halls, horticultural facilities (gardening houses, agricultural houses, and the like), and the like (see Patent Document 1). For sports facilities and the like, a color film made of fluororesin film colored white or blue is also used (see, for example, Patent Document 2).

When fluororesin film was first adopted for use in membrane structural applications, due to light weight in comparison with glass, major features of a membrane material made of a fluororesin film were the possibility of lightweight construction, including a framework, and the possibility of creating a curved surface shape.

Membrane materials using color films had advantages such as capability of determining overall building impression, capability of providing illusionary light at night by means of lighting equipment (for example, LED lighting) placed inside membrane materials, and capability of making details of lighting equipment not clearly visible from the outside of a building, because the haze value of colored films is typically 50% or more.

Methods of installing membrane materials can be divided into two: a cushion method and a tension method. In a cushion method, a plurality of membrane structure films are fixed to a framework to form a multi-layered membrane, and air is supplied in between. In a tension method, a single membrane structure film is fixed to a framework.

In recent years, a tension method is increasingly used due to low installation costs.

RELATED ART DOCUMENTS

Patent Documents

Patent Document 1: Japanese Patent No. 3623008
Patent Document 2: Japanese Patent No. 5365195

SUMMARY OF INVENTION

Technical Problem

However, there is a problem that conventional membrane materials, especially in a tension method, are visually inferior in terms of dignity compared to glass of about 10 mm thick.

In Patent Documents 1 to 2, improvement of weather resistance of fluororesin film is considered, but no consideration is made to give dignity to fluororesin film.

An object of the present invention is to provide a film with a glass-like, dignified appearance.

Solution to Problem

The disclosures are to provide a film having a feature of any one of the following [1] to [15].

[1] A film, comprising:
a fluororesin;
a chromatic pigment; and
a black pigment,
in which a visible light transmittance of the film is from 5 to 60% and a haze value of the film is 30% or less.

[2] The film according to [1], comprising a fluororesin layer comprising the fluororesin, the chromatic pigment and the black pigment.

[3] The film according to [2], wherein the black pigment comprises at least one selected from the group consisting of carbon black, an interference aluminum pigment, iron oxide, titanium black, cobalt/iron/chromium composite oxide, copper/chromium/manganese composite oxide, iron/chromium composite oxide, and manganese/bismuth composite oxide.

[4] The film according to [2] or [3], wherein a content of the black pigment per unit area of the fluororesin layer is from 0.003 to 0.150 g/m$^2$.

[5] The film according to [1], comprising a fluororesin layer comprising the fluororesin and the chromatic pigment, and a layer comprising the black pigment.

[6] The film according to [5], wherein a thickness of the layer comprising the black pigment is from 0.5 to 50 nm.

[7] The film according to [5] or [6], wherein the layer containing the black pigment is a layer formed by a dry method.

[8] The film according to any one of [5] to [7], wherein the black pigment comprises at least one selected from the group consisting of a metal and an alloy.

[9] The film according to any one of [5] to [8], wherein the black pigment comprises at least one selected from the group consisting of chromium, a chromium alloy, nickel, a nickel alloy, titanium, a titanium alloy, zinc, a zinc alloy, indium and an indium alloy.

[10] The film according to any one of [5] to [9], further comprising a protective layer on or above the layer containing the black pigment.

[11] The film according to [10], wherein the protective layer is a layer formed from a fluororesin with a reactive functional group, or a layer formed from at least one inorganic material selected from the group consisting of an inorganic oxide, an inorganic nitride, and an inorganic oxynitride.

[12] The film according to any one of [2] to [11], wherein a content of the chromatic pigment per unit area of the fluororesin layer is from 0.030 to 0.80 g/m$^2$.

[13] The film according to any one of [1] to [12], wherein the chromatic pigment has a blue or green color tone.

[14] The film according to any one of [1] to [13], wherein the fluororesin comprises at least one selected from the group consisting of vinyl fluoride polymer, vinylidene fluoride polymer, vinylidene fluoride-hexafluoropropylene copolymer, tetrafluoroethylene-hexafluoropropylene-vinylidene fluoride copolymer, tetrafluoroethylene-propylene copolymer, tetrafluoroethylene-vinylidene fluoride-propylene copolymer, ethylene-tetrafluoroethylene copolymer, hexafluoropropylene-tetrafluoroethylene copolymer, ethylene-hexafluoropropylene-tetrafluoroethylene copolymer, perfluoro(alkyl vinyl ether)-tetrafluoroethylene copolymer, chlorotrifluoroethylene polymer, and ethylene-chlorotrifluoroethylene copolymer.

[15] A membrane structure film, comprising the film according to any one of [1] to [14].

Advantageous Effects of Invention

A film in the present invention has a dignified appearance like glass.

DESCRIPTION OF EMBODIMENTS

The following terms in the present disclosure have the following meanings.

The term "film" encompasses a single-layer film and a layered film in which a plurality of layers are layered.

The term "achromatic color" refers to colors such as white, gray and black, which contain only the dimension of lightness (or no chromatic color at all).

The term "chromatic color" refers to all colors other than achromatic color (colors that has chroma regardless of whether they are strong or weak in hue).

The term "monomer-based unit" of a polymer indicates a constituent portion of the polymer, derived from a monomer, formed by polymerization of the monomer. The unit may be a unit formed directly by a polymerization reaction, or may be a unit in which a part of the structure of the unit is converted to another structure by chemical conversion of a polymer obtained by a polymerization reaction. Herein, "monomer-based unit" is also referred to as "monomer unit".

The "visible light transmittance" is measured in accordance with DIN EN 410:1998. Details are as described in Examples below.

The "haze value" is measured in accordance with JIS K7136:2000. Details are as described in Examples below.

The numerical range "from A to B" means that A and B are included as the lower limit and the upper limit, respectively. In a numerical range described in steps herein, an upper limit value or a lower limit value described in one numerical range may be replaced by upper limit values or lower limit values in other stepwise described numerical ranges. In a numerical range described herein, an upper limit value or a lower limit value of the numerical range may be replaced by values indicated in Examples.

The term "layer" herein encompasses, when observing an area in which the layer exists, cases in which the layer is formed over the entire area as well as cases in which the layer is formed only in a portion of the area.

Figure 1:
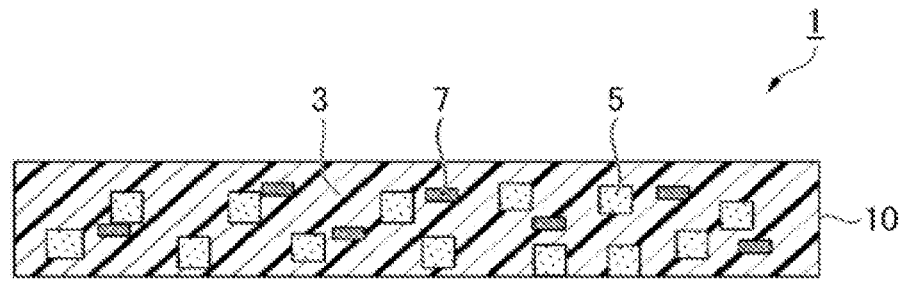
FIG. 1 is a schematic sectional view illustrating a film in a first embodiment.
Figure 2:
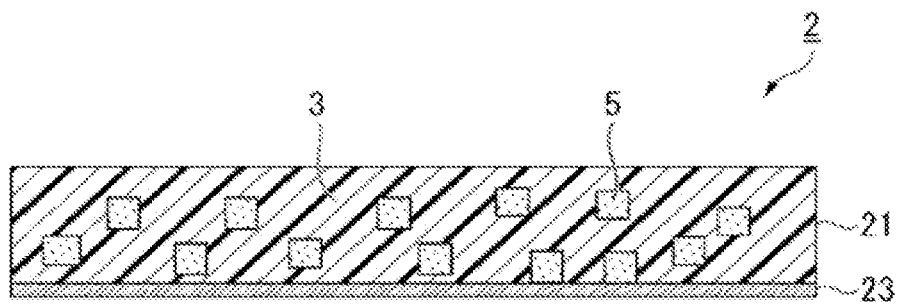
FIG. 2 is a schematic sectional view illustrating a film in a second embodiment.
Figure 3:
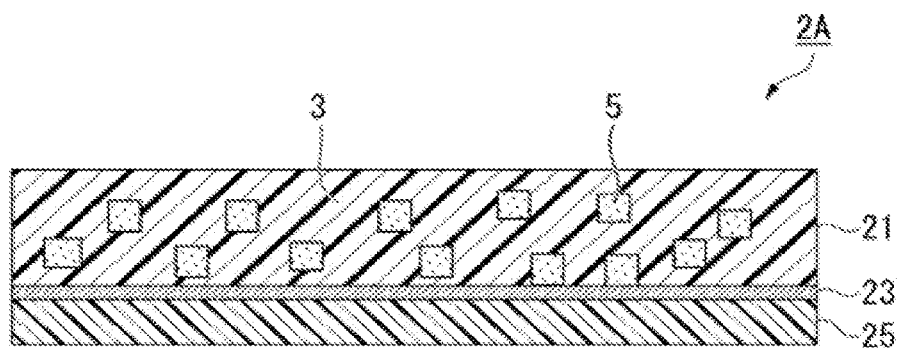
FIG. 3 is a schematic sectional view of a variant of the film in the second embodiment.

The dimensional ratios in FIGS. 1 to 3 are indicated for convenience of explanation and different ratios are encompassed. In FIGS. 1 to 3, each component is indicated as a rectangle for convenience, but this does not mean that the shape of each component indicates a rectangle.

The film in the present disclosure contains a fluororesin, a chromatic pigment, and a black pigment, in which a visible light transmittance of the film is from 5 to 60% and a haze value of the film is 30% or less.

The visible light transmittance of the film is preferably from 10 to 40%.

The haze value of the film is preferably 20% or less. The lower the haze value, the more preferable, and the lower limit is not particularly limited, and is, for example, 2%.

In a case in which the visible light transmittance of a film is 5% or higher and the haze value is 30% or lower, the film transmits light, and most of the light transmitted becomes direct light. In a case in which a film contains a chromatic pigment and a black pigment to such an extent that the visible light transmittance is 60% or less, the light transmitted through the film becomes less chroma light. As a result, even when the thickness of a film is thin, the appearance of the film has a sense of dignity and depth feel similar to that of glass having a thickness of about 10 mm thick.

In a case in which the visible light transmittance of a film is 5% or higher, when the film is used as a membrane structure film, defects such as darkening of a room during daytime to the same degree as when a metal roof or concrete wall with 0% visible light transmittance is used are suppressed, and advantages of a membrane structure film using fluororesins are readily exhibited. In a case in which the visible light transmittance is 60% or less or the haze value is 30% or less, it is easy to achieve glass-like dignity.

Hereinafter, the film in the disclosure will be described with reference to the accompanying drawings, by providing embodiments. The film of the invention, however, is not limited to the following embodiments.

First Embodiment

FIG. 1 is a schematic sectional view illustrating a film 1 in a first embodiment.

The film 1 has a fluororesin layer 10 containing a fluororesin 3, a chromatic pigment 5, and a black pigment 7. The fluororesin layer 10 may be composed of a composition (hereinafter, also referred to as "Composition A") containing the fluororesin 3, the chromatic pigment 5 and the black pigment 7.

The visible light transmittance of the film 1 is from 5 to 60%, and the haze value is 30% or less. Preferred values of the visible light transmittance and the haze value are as described above.

From the viewpoint of superior strength, a thickness of the film 1 is preferably 100 μm or more, and particularly preferably 200 μm or more. From the viewpoint of ease of handling as a membrane structure film, the thickness of the film 1 is preferably 1,000 μm or less, and particularly preferably 500 μm or less.

The fluororesin layer 10 or Composition A contains the fluororesin 3, the chromatic pigment 5, and the black pigment 7. The chromatic pigment 5 and the black pigment 7 are dispersed in the fluororesin 3.

In the fluororesin layer 10 or Composition A, part of the fluororesin 3 may be replaced by another thermoplastic resin.

The fluororesin layer 10 or Composition A may further contain another component as necessary to an extent that does not impair an effect of the invention.

<Fluororesin>

The fluororesin 3 is not particularly limited as long as the resin is a thermoplastic resin containing a fluorine atom in the molecular structure, and a variety of known fluorine-containing resins can be used.

A ratio (hereinafter, also referred to as "fluorine atom content") of fluorine atoms to a total mass of the fluororesin 3 is preferably 45% by mass or more, more preferably 50% by mass or more, and particularly preferably 55% by mass or more. In a case in which the fluorine atom content is equal to or higher than the above-described lower limit, the weather resistance, the stain resistance, the chemical resistance, and the non-adhesiveness of a film are further excellent, and in particular, the non-adhesiveness and the stain resistance are excellent.

The fluororesin 3 preferably has a stress at 10% elongation of 10 MPa or more.

The value of stress at 10% elongation is determined for a film made of a fluororesin by the method specified in JIS K7127:1999 (Plastics—Test methods for tensile properties—Part 3: Test conditions for films and sheets). Using dumbbell No. 5 shape as a test piece, the value of stress at 10% elongation is calculated by dividing the tension when stretched at a tensile speed of 200 mm/minute by the original cross-sectional area of the film.

The stress at 10% elongation is independent of the thickness of a film and depends largely on the composition of a fluororesin. In a case in which the stress at 10% elongation is 10 MPa or higher, a film has excellent accumulated snow resistance and wind pressure resistance.

The fluororesin 3 is preferably a fluoroolefin polymer. The fluoroolefin polymer may be a monopolymer or a copolymer of fluoroolefin. Examples of the copolymer include a copolymer of two or more fluoroolefins or a copolymer of one or more fluoroolefins and one or more other monomers that can be copolymerized with fluoroolefins. The other monomer is preferably an olefin or a perfluoro(alkyl vinyl ether). The number of carbon atoms of each of fluoroolefin and olefin is preferably 2 or 3. The number of carbon atoms of perfluoro (alkyl vinyl ether) is preferably from 3 to 6. The other monomers may be used singly, or two or more kinds thereof may be used in combination.

From the viewpoint of excellent stain resistance or chemical resistance, the fluororesin 3 is preferably a fluororesin without reactive functional groups such as hydroxyl groups or carboxy groups.

Examples of preferable fluororesin 3 include vinyl fluoride polymer (hereinafter, also referred to as "PVF"), vinylidene fluoride polymer (hereinafter, also referred to as "PVDF"), vinylidene fluoride-hexafluoropropylene copolymer, tetrafluoroethylene-hexafluoropropylene-vinylidene fluoride copolymer (hereinafter, also referred to as "THV"), tetrafluoroethylene-propylene copolymer, tetrafluoroethylene-vinylidene fluoride-propylene copolymer, ethylene-tetrafluoroethylene copolymer (hereinafter, also referred to as "ETFE"), hexafluoropropylene-tetrafluoroethylene copolymer (hereinafter, also referred to as "FEP"), ethylene-hexafluoropropylene-tetrafluoroethylene copolymer (hereinafter, also referred to as "EFEP"), perfluoro(alkyl vinyl ether)-tetrafluoroethylene copolymer (hereinafter, also referred to as "PFA"), chlorotrifluoroethylene polymer (hereinafter, also referred to as "PCTFE"), and ethylene-chlorotrifluoroethylene copolymer (hereinafter, also referred to as "ECTFE"). These fluororesins may be used singly, or two or more kinds thereof may be used in combination. A total content of the fluororesins listed above with respect to the total amount of fluororesin is preferably 90% by mass or more, more preferably 95% by mass or more, still more preferably 99% by mass or more, and particularly preferably 100% by mass.

Among the above, PFA, FEP, ETFE or ETCFE is preferable, and ETFE is particularly preferable in terms of cost, mechanical strength, sputtering film formability, and the like.

ETFE is a copolymer containing an ethylene (hereinafter, also referred to as "E") unit and a tetrafluoroethylene (hereinafter, also referred to as "TFE") unit.

ETFE may further contain another monomer unit other than E and TFE, if necessary.

A molar ratio of E units/TFE units in ETFE is preferably from 40/60 to 70/30, and more preferably from 40/60 to 60/40.

A total content of E and TFE units in 100% by mole of all units constituting ETFE is preferably 90% by mole or more, more preferably 95% by mole or more, and may be 100% by mole.

The other monomer may be any monomer that can copolymerize with E and TFE, and examples thereof include a fluorine-containing ethylene such as $CF_2=CFCl$ or $CF_2=CH_2$; a fluorine-containing propylene such as $CF_2=CFCF_3$ or $CF_2=CHCF_3$; a fluorine-containing alkylethylene with a fluoroalkyl group having from 2 to 10 carbon atoms such as $CH_2=CHC_2F_5$, $CH_2=CHC_4F_9$, $CH_2=CFC_4F_9$, or $CH_2=CF(CF_2)_3H$; a perfluoro(alkyl vinyl ether) such as $CF_2=CFO(CF_2CFXO)_mR^f$ (in the formula, $R^f$ represents a perfluoroalkyl group having from 1 to 6 carbon atoms, X represents a fluorine atom or a trifluoromethyl group, and m represents an integer from 1 to 5); and a vinyl ether with a group convertible to a carboxylic acid group or a sulfonic acid group such as $CF_2=CFOCF_2CF_2CF_2COOCH_3$ or $CF_2=CFOCF_2CF(CF_3)OCF_2CF_2SO_2F$.

In a case in which ETFE contains another monomer unit, a content of the other monomer unit in 100% by mole of the total units constituting ETFE is preferably from 0.3 to 10% by mole, and more preferably from 1 to 5% by mole.

A melting point of the fluororesin 3 is preferably 220° C. or higher. In the membrane structure, a maximum temperature of the membrane structure film may reach up to about 80° C. In a case in which the melting point is 220° C. or higher, the heat resistance is sufficient for use in membrane structure films.

The melting point of the fluororesin 3 is preferably 280° C. or less, and particularly preferably 270° C. or less. In a case in which the melting point is equal to or less than the above-described upper limit, the haze value of the fluororesin layer 10, and in turn, the haze value of the film 1, tends to be easily reduced to 30% or less.

The haze value of a film is determined by the crystallinity, which is determined by the composition of a fluororesin and the cooling rate at which the film is molded, the thickness of the film, and the particle diameter of pigments (chromatic pigments and black pigments) dispersed in the film and the concentration of the pigments. One approach for fluororesins to obtain films with low haze value is to use a less crystalline resin, which is melted and then rapidly cooled. Resins with low crystallinity have high transparency but generally tend to have a low melting point.

The melting point is the temperature corresponding to the maximum value of the melting peak of a resin, as measured by differential scanning calorimetry (DSC).

A content of the fluororesin 3, with respect to a total mass of the fluororesin layer 10 or a total mass of Composition A, is preferably 50% by mass or more, and more preferably 70% by mass or more. An upper limit of the content of the fluororesin 3, with respect to the total mass of the fluororesin layer 10 or Composition A, is, for example, 99.9998% by mass.

<Chromatic Pigment>

As the chromatic pigments 5, a variety of pigments with tones other than achromatic may be used, and may be selected as appropriate from among organic pigments, inorganic pigments, luminous pigments (aluminum, stainless steel, pearl mica, and the like), and the like. Infrared absorbing pigments, near-infrared reflecting pigments, and the like may also be used as the chromatic pigments 5, as long as the pigments have absorption in the visible light range and have a color tone other than achromatic.

Examples of inorganic and organic pigments include an aluminum-cobalt composite oxide (blue), a tin-zinc-titanium composite oxide (orange), iron oxide (red), a cobalt-nickel-zinc-titanium composite oxide (green), a cobalt-magnesium-titanium composite oxide (green), a bismuth vanadate composite oxide (yellow), a nickel-antimony-chromium composite oxide (yellow), a titanium-antimony-nickel composite oxide (yellow), a zinc-iron composite oxide (brown), a cobalt-nickel-silicon composite oxide (purple), a cobalt-lithium-phosphorus composite oxide (purple), a manganese oxide (purple), a copper-iron-manganese composite oxide (deep purple), titanium nitride (deep blue), copper phthalocyanine (blue, green), cobalt phthalocyanine (blue), and quinacridone (red, purple).

Specific examples of chromatic infrared absorbing pigments and near-infrared reflecting pigments with absorption in the visible light range include a boronated compound such as lanthanum hexaboride (green), a tungsten compound such as cesium tungstate (blue), indium tin oxide (light blue), and tin antimony oxide (blue).

As the chromatic pigment 5, an organic pigment such as copper phthalocyanine or quinacridone is preferable in that the haze value is relatively less likely to increase when the content thereof is increased.

As the chromatic pigment 5, a chromatic pigment such as an aluminum-cobalt composite oxide (blue), a cobalt-nickel-zinc-titanium composite oxide (green), a cobalt-magnesium-titanium composite oxide (green), a copper phthalocyanine (blue, green), a titanium nitride (deep blue), or a cobalt phthalocyanine (blue), with a blue or green color tone is preferable. In a case in which the chromatic pigment 5 is blue or green, the color tone of the film 1 can be made reminiscent of the sky, sea, or forest.

The chromatic pigment 5 may be used singly, or two or more kinds thereof may be used in combination.

A content of the chromatic pigment 5 depends on the thickness of the fluororesin layer 10, and the content with respect to the total mass of the fluororesin layer 10 or Composition A is preferably from 0.0001 to 0.2% by mass, more preferably from 0.005 to 0.1% by mass, and particularly preferably from 0.01 to 0.07% by mass. In a case in which the content of the chromatic pigment 5 is within the above-described range, the content of the chromatic pigment 5 per unit area of the fluororesin layer 10 is likely to be within the desirable range described below when the fluororesin layer 10 is made to have the desirable thickness described below.

<Black Pigment>

The black pigment 7 lowers (darkens) the chroma of transmitted light of a film to enhance dignity.

Examples of the black pigment 7 include carbon black, interference aluminum pigment, iron oxide, titanium black, cobalt-iron-chromium composite oxide, copper-chromium-manganese composite oxide, iron-chromium composite oxide, and manganese-bismuth composite oxide. The black pigment 7 may be used singly, or two or more kinds thereof may be used in combination. Among them, carbon black is preferable in that the particle diameter is smaller than that of other black pigments and can reduce the visible light transmittance without significantly increasing the haze value.

As examples of carbon blacks, those with an average particle diameter of 3 to 500 nm are generally used, and examples thereof include acetylene black, furnace black, channel black, and lamp black. Among these, acetylene black is preferable from the viewpoint of relatively small surface area and excellent dispersibility in the fluororesin 3. Examples of acetylene black include DENKA BLACK (registered trademark) manufactured by DENKA Corporation, and Ace black manufactured by Soltex Corporation.

The average particle diameter is measured by laser light scattering.

A content of the black pigment 7, with respect to the total mass of the fluororesin layer 10 or Composition A, is preferably from 0.0001 to 0.04% by mass, and particularly from 0.01 to 0.03% by mass. In a case in which the content of the black pigment 7 is within the above-described range, when the fluororesin layer 10 is made to have the preferable thickness described below, the content of the black pigment 7 per unit area of the fluororesin layer 10 is likely to be within the preferable range described below.

<Other Thermoplastic Resin>

Examples of the other thermoplastic resin include an acrylic resin, a polyester resin, a polyurethane resin, a nylon resin, a polyethylene resin, a polyimide resin, a polyamide resin, a polyvinyl chloride resin, and a polycarbonate resin. The other thermoplastic resins may be used singly, or two or more kinds thereof may be used in combination.

A content of the other thermoplastic resin with respect to 100% by mass of the total of the fluororesin 3 and the other thermoplastic resin is preferably 30% or less, more preferably 10% or less, and may be 0% by mass.

<Other Components>

The fluororesin layer 10 or Composition A may contain an antioxidant, metallic soap, or hydrophobic agent to ensure favorable dispersion of the chromatic pigment 5 and the black pigment 7 in the fluororesin 3. In a case in which an antioxidant or metallic soap is used, coloration during compounding may be prevented. In a case in which a hydrophobic agent is used, pigment aggregation in a film may be suppressed and coloration during compounding may be prevented. An antioxidant or metallic soap may be used in combination with a hydrophobic agent.

As an antioxidant, a known antioxidant may be used, and examples thereof include a phosphite-based antioxidant, a phenol-based antioxidant, and a sulfur-based antioxidant. In particular, a phosphite-based phosphorus antioxidant is highly effective in preventing coloration during compounding when an organic pigment is used, which is preferable.

Examples of metallic soaps include zinc stearate and lithium stearate.

These antioxidants and metallic soaps may be used singly, or two or more kinds thereof may be used in combination.

A total content of antioxidants and metallic soaps is, for example, about from 0.2 to 10 parts by mass with respect to 100 parts by mass of a total of the chromatic pigment 5 and the black pigment 7.

Examples of the hydrophobic agent include a silane coupling agent with an alkyl group and a silicone compound.

Examples of the alkyl group that the silane coupling agent contains include an alkyl group having from 1 to 12 carbon atoms. Examples of the silane coupling agent include a trialkoxysilane such as isobutyltrimethoxysilane, hexyltrimethoxysilane, or (3,3,3-trifluoropropyl)trimethoxysilane; a silazane such as hexamethyldisilazane; and a chlorosilane such as dimethyldichlorosilane. Among these, isobutyltrimethoxysilane is preferable as a silane coupling agent.

The silicone compound is an organopolysiloxane with an organic group. As the organic group, an alkyl group having from 1 to 4 carbon atoms and a phenyl group is preferable.

As a silicone compound, what is commonly referred to as silicone oil may be used. Examples of the silicone oil include a straight silicone oil such as dimethyl silicone oil or phenyl methyl silicone oil; alkyl-modified silicone oil; alkyl-aralkyl-modified silicone oil; and fluorinated alkyl-modified silicone oil. Among these, a dimethyl silicone oil is preferable in terms of cost, and a phenyl methyl silicone oil is preferable in terms of heat resistance.

The kinematic viscosity of the silicone oil at 25° C. is preferably 1,500 mm$^2$/second or less. In a case in which the kinematic viscosity is 1,500 mm$^2$/sec or less, the silicone oil may easily adhere thinly and evenly to the surfaces of chromatic pigments and black pigments, and the dispersibility of the chromatic pigments 5 and the black pigments 7 in the fluororesin 3 is more favorable.

Commercially available silicone compounds may be used. Examples of the dimethyl silicone oil include SH200 (product name) manufactured by DuPont Toray Specialty Materials K.K., KF96 (product name) manufactured by Shin-Etsu Chemical Co., Ltd., and TSF451 (product name) manufactured by Momentive Performance Materials, Inc. Examples of the phenyl methyl silicone oil include SH510 (product name), SH550 (product name), and SH710 (product name) manufactured by Toray Dow Corning Silicones, Inc. and KF54 (product name) manufactured by Shin-Etsu Chemical Co., Ltd. These silicone compounds may have various molecular weights (viscosities).

A content of the hydrophobic agent, with respect to 100 parts by mass of the total of the chromatic pigment 5 and the black pigment 7 is, for example, about from 1.5 to 10 parts by mass.

(Fluororesin Layer)

In one embodiment, the fluororesin layer 10 is composed of Composition A.

A content of the chromatic pigment 5 per unit area of the fluororesin layer 10 is preferably from 0.030 to 0.80 g/m$^2$, and particularly preferably from 0.050 to 0.50 g/m$^2$. In a case in which the content of the chromatic pigment 5 is equal to or greater than the lower limit described above, the color tone of the film 1 becomes sufficiently dark, and dignity is easily achieved. In a case in which the content of the chromatic pigment 5 is equal to or less than the upper limit described above, the haze value is lowered and dignity is easily achieved.

A content of the black pigment 7 per unit area of the fluororesin layer 10 is preferably from 0.003 to 0.150 g/m$^2$, more preferably from 0.005 to 0.150 g/m$^2$, still more preferably from 0.010 to 0.120 g/m$^2$, and particularly preferably from 0.040 to 0.120 g/m$^2$. In a case in which the content of the black pigment 7 is equal to or greater than the lower limit described above, the color tone of the film 1 becomes sufficiently dark, and dignity is easily achieved. In a case in which the content of the black pigment 7 is equal to or less than the upper limit described above, the haze value is lowered and dignity is easily achieved, and the color tone of a film becomes chromatic, which is excellent in terms of design.

A preferable thickness of the fluororesin layer 10 is the same as the preferable thickness of the film 1.

(Method of Producing Film)

The film 1 may be manufactured, for example, by mixing the fluororesin 3, the chromatic pigment 5, the black pigment 7, and, if necessary, another thermoplastic resin or another component to prepare Composition A, and then forming the resulting Composition A into a film using a known molding method.

(Function/Effect)

The film 1 described above contains the fluororesin 3, the chromatic pigment 5, and the black pigment 7; or includes the fluororesin layer 10 containing the fluororesin 3, the chromatic pigment 5, and the black pigment 7; with a visible light transmittance of the film 1 of from 5 to 60% and a haze value of the film 1 of 30% or less, thus having a glass-like appearance with dignity. For example, even when the film 1 is less than 1 mm thick, the film feels as if the film has the same thickness and weight as a 10 mm thick glass.

The film 1 also has favorable weather resistance since the film contains the fluororesin 3.

A conventional fluororesin film, such as one used for membrane structure film, tends to have low visible light transmittance, high haze value, and whitish color as the film becomes thicker, and conversely, such a film tends to have high visible light transmittance, low haze value, and transparency as the film becomes thinner.

On the other hand, colored glass for building materials generally has a thickness of from 2 to 20 mm, low visible light transmittance, but low haze value and high transparency. Colored glass is heavy in weight.

Since the film 1 has low visible light transmittance and low haze value, optical properties more similar to building glass than conventional fluororesin film, it is thought that the film 1 is perceived as thicker and heavier, regardless of the actual thickness and the mass of the material.

Second Embodiment

FIG. 2 is a schematic sectional view of a film 2 of a second embodiment. In the following, components corresponding to the first embodiment are indicated with the same symbols and detailed descriptions thereof are omitted.

The film 2 includes a fluororesin layer 21 containing the fluororesin 3 and the chromatic pigments 5, and a layer 23 containing black pigments (hereinafter, also referred to as a "black pigment layer") provided on or above the fluororesin layer 21. The fluororesin layer 21 may be composed of a composition containing the fluororesin 3 and the chromatic pigment 5 (hereinafter, also referred to as "Composition B"). A black pigment layer may consist of a black pigment or may contain a component other than black pigments. A content of the black pigment to a total amount of the black pigment layer is preferably 90% by mass or more, more preferably 95% by mass or more, still more preferably 99% by mass or more, and particularly preferably 100% by mass (thus, the black pigment layer consists of a black pigment).

A visible light transmittance of the film 2 is from 5 to 60%, and a haze value is 30% or less. Preferred values for visible light transmittance and haze value are as described above.

The preferred thickness of the film 2 is the same as that of the film 1.

The fluororesin layer 21 or Composition B contains the fluororesin 3 and the chromatic pigment 5. The chromatic pigment 5 is dispersed in the fluororesin 3.

The fluororesin layer 21 or Composition B may further contain the black pigment 7.

In the fluororesin layer 21 or Composition B, part of the fluororesin 3 may be replaced by another thermoplastic resin. Examples of the other thermoplastic resin include the same as described above.

The fluororesin layer 21 or Composition B may further contain another component as necessary to an extent that an effect of the invention is not impaired. Examples of the other component include the same as described above.

In the fluororesin layer 21 or Composition B, the respective preferable contents of the fluororesin 3, the chromatic pigment 5, the other thermoplastic resin, and the other component are the same as the preferable contents of the respective components in Composition A.

A content of the black pigment 7, with respect to a total mass of the fluororesin layer 21 or Composition B is preferably 0.03% by mass or less, and particularly preferably 0.00% by mass.

(Fluororesin Layer)

In one embodiment, the fluororesin layer 21 is composed of Composition B.

A content of the chromatic pigment 5 per unit area of the fluororesin layer 21 is preferably from 0.030 to 0.80 $g/m^2$, and particularly preferably from 0.050 to 0.50 $g/m^2$. In a case in which the content of the chromatic pigment 5 is equal to or greater than the lower limit described above, the color tone of the film 2 becomes sufficiently dark, and dignity is easily achieved. In a case in which the content of the chromatic pigment 5 is equal to or less than the upper limit described above, the haze value is lowered and dignity is easily achieved.

From the viewpoint of excellent strength, a thickness of the fluororesin layer 21 is preferably 100 µm or more, and particularly preferably 200 µm or more. From the viewpoint of ease of handling the film 2 as a membrane structure film, the thickness of the fluororesin layer 21 is preferably 1,000 µm or less, and particularly preferably 500 µm or less.

The fluororesin layer 21 may be surface treated on the black pigment layer 23 side to improve adhesion between the fluororesin layer 21 and a black pigment layer 23.

Surface treatment is not particularly limited as long as an effect of the invention is not impaired, and may be selected as appropriate from among known surface treatment methods. Examples thereof include plasma treatment and corona discharge treatment. Among these, plasma treatment is preferable because such a treatment may treat the entire treated surface of the fluororesin layer 21 homogeneously, the load on the fluororesin layer 21 surface is small, and influence on the long-term stability of the adhesion is small.

(Black Pigment Layer)

The black pigment layer 23 lowers the chroma of light transmitted through a film (darkens the color) and increases dignity, like the black pigment 7 dispersed in the fluororesin layer 10 in the first embodiment.

The black pigment constituting the black pigment layer 23 preferably contains at least one selected from the group consisting of a metal and an alloy, and more preferably contains at least one selected from the group consisting of chromium, a chromium alloy, nickel, a nickel alloy, titanium, a titanium alloy, zinc, a zinc alloy, indium and an indium alloy. The black pigment may consist of at least one selected from the group consisting of a metal and an alloy, and may contain another black pigment. A total content of at least one selected from the group consisting of a metal and an alloy with respect to a total amount of black pigment is preferably 90% by mass or more, more preferably 95% by mass or more, still more preferably 99% by mass or more, and particularly preferably 100% by mass.

A metal or an alloy reduces transmittance by absorption or reflection, making a film darker. The absorption characteristics for wavelengths are almost the same as the absorption characteristics of carbon black which is a representative of black pigment, a cobalt/iron/chromium composite oxide, or the like. Accordingly, a metal or an alloy may be regarded as a black pigment. A metal or an alloy is strongly bonded to the surface of the fluororesin layer 21 and has excellent adhesion with the fluororesin layer 21.

Among the above, chromium or a chromium alloy is particularly preferable as a metal or alloy that constitutes the black pigment layer 23 in terms of the excellent adhesion to the fluororesin layer 21.

As a chromium alloy, at least one selected from the group consisting of a tin-chromium alloy, a titanium-chromium alloy, a nickel-chromium alloy, a zirconium-chromium alloy, a niobium-chromium alloy, and a tantalum-chromium alloy is preferable.

Considering the adhesion with the fluororesin layer 21, a ratio of chromium atoms in 100% by mass of a chromium alloy is preferably 20% by mass or more, and particularly preferably 30% by mass or more. The upper limit is not particularly limited and may be selected in consideration of the molding speed of the black pigment layer 23.

The black pigment layer 23 may be composed of a single layer or a plurality of different types of black pigments (for example, a layered membrane composed of a chromium membrane and a chromium alloy membrane, or a layered membrane composed of different chromium alloy compositions).

A thickness of the black pigment layer 23 (or a total thickness when composed of a plurality of layers) is preferably from 0.5 to 50 nm. The lower limit is preferably 1 nm, and particularly preferably 3 nm. The upper limit is more preferably 25 nm, and particularly preferably 10 nm.

In a case in which the thickness of the black pigment layer 23 is equal to or greater than the above-described lower limit, the adhesion with the fluororesin layer 21 is easily secured, and light transmitted through a film is likely to be darkened. In particular, in a case in which the thickness is 3 nm or more, visible light is clearly reflected, resulting in a film with reflective characteristics similar to architectural glass, and more dignity. In a case in which the thickness of the black pigment layer 23 is equal to or less than the above-described upper limit, it is easier to ensure the flexibility of the film 2, adhesion with the fluororesin layer 21, and visible light transmittance.

The black pigment layer 23 is preferably a layer formed by a dry method. A layer formed by a dry method tends to have a more uniform thickness, higher adhesion to the fluororesin layer 21, and lower haze value than a layer formed by a wet method.

Examples of the dry method include physical vapor deposition (hereinafter referred to as "PVD") and chemical vapor deposition (hereinafter, referred to as "CVD").

Examples of the PVD method include vacuum evaporation, sputtering method, and ion plating method, and any of these methods may be used. Among these methods, the sputtering method is preferable in terms of excellent productivity, wide industrial use, and the ability to obtain a very dense film and uniform thickness film with high adhesion to the fluororesin layer 21.

As the sputtering method, any of a DC sputtering method, a high-frequency sputtering method, or an AC sputtering method may be used. A DC sputtering method or an AC sputtering method is preferable in terms of excellent productivity, such as efficient deposition on a large-area substrate at a large deposition rate.

Examples of the CVD method include a plasma CVD method, a thermal CVD method, and a catalytic CVD method, any of which may be used. Among these methods, a plasma CVD method is preferable in terms of excellent productivity, wide industrial use, and the ability to obtain a very dense film with high adhesion to the fluororesin layer 21 at a uniform thickness.

Specific formation conditions for forming the black pigment layer 23 may be set according to methods and materials to be used.

For example, a layer composed of chromium is obtained by using a chromium target and depositing a film by a sputtering method in an inert gas atmosphere such as argon.

Specific sputtering conditions at this time vary depending on various conditions such as the type of equipment, target composition, and the like, and may be selected as appropriate. Typically, it is preferable to perform sputtering at a sputtering gas pressure of from 0.1 to 1.3 Pa and a power density of from 0.5 to 5 W/cm$^2$ after evacuating to $8 \times 10^{-4}$ Pa and introducing argon into a container.

A layer composed of a chromium alloy can be deposited in the same manner as above, except that a chromium alloy target is used in place of the chromium target.

(Method of Producing Film)

Film 2 may be manufactured, for example, by mixing the fluororesin 3, the chromatic pigment 5, and another thermoplastic resin or another component as needed to prepare Composition B; forming the resulting Composition B into a film using a known molding method; applying surface treatment to the formed film (the fluororesin layer 21) as needed; and then forming the black pigment layer 23.

(Function/Effect)

The film 2 described above includes the fluororesin layer 21 containing the fluororesin 3 and the chromatic pigment 5, and the black pigment layer 23, in which a visible light transmittance of the film 2 is from 5 to 60% and a haze value of the film 2 is 30% or less, thus having a glass-like appearance with dignity. For example, even when the film 2 is less than 1 mm thick, the film feels as if the film has the same thickness and weight as a 10 mm thick glass.

The film 2 also has favorable weather resistance since the film contains the fluororesin 3.

Other Embodiment

The film in the present disclosure has been described above by way of embodiments, but the present invention is not limited to the above-described embodiments. Each configuration, combination thereof or the like in the above-described embodiments is only an example, and additions, omissions, substitutions, and other changes in the configuration are possible within an extent that does not depart from the gist of the invention.

For example, as illustrated in FIG. 3, a protective layer 25 may be provided on or above the black pigment layer 23 of the film 2 in the second embodiment.

The protective layer 25 protects the black pigment layer 23.

In a case in which the adhesion between the black pigment layer 23 and the fluororesin layer 21 is high, for example, and in a case in which the black pigment layer 23 is made of a metal or an alloy, peeling is unlikely to occur even without the protective layer 25, and no peeling occurs, for example, in a SELLOTAPE (registered trademark) peeling test after cross cutting on a board, or after a weather resistance acceleration test. From the viewpoint of suppressing film thinning or scratching of the black pigment layer 23 against physical abrasion, such as rubbing the surface of the black pigment layer 23 with an eraser, it is preferable to provide the protective layer 25.

In membrane structure films and agricultural greenhouse films, it is preferable that the film 2 is arranged so that the fluororesin layer 21 is located outside (sun side) of the black pigment layer 23 in consideration of weather resistance. In this case, even without the protective layer 25, the black pigment layer 23 does not come in contact with sand, a pebble, snow, ice, or the like outdoors, and therefore film thinning of the black pigment layer 23 due to these contacts need not be considered. However, during the process of cutting the film 2, a heat-sealing bonding between the films 2, transportation, and installation before installing the film 2, the film 2 may be dragged on a worktable or the black pigment layer 23 surface may be rubbed with a bare hand. From the viewpoint of reducing occurrence of scratches due to abrasion at such times, the protective layer 25 may be provided even when the fluororesin layer 21 is located outside (sun side) of the black pigment layer 23.

The film 2A with the protective layer 25 on or above the black pigment layer 23 has excellent abrasion resistance because the black pigment layer 23 is not easily scratched by abrasion during handling.

The protective layer 25 is preferably a layer formed from a fluororesin with a reactive functional group or from at least one inorganic material selected from the group consisting of an inorganic oxide, an inorganic nitride, and an inorganic oxynitride.

The protective layer 25 may be either a layer formed by a dry method or a layer formed by a wet method, but a layer formed by a dry method is preferable. The layer formed by the dry method tends to have a more uniform thickness and better adhesion to the black pigment layer 23 than a layer formed by the wet method.

Examples of the dry method include the same as described above.

In a wet method, a protective layer is formed by applying and drying a coating liquid containing a component or a precursor that constitutes the protective layer and a liquid medium (water, organic solvent, or the like) on or above the black pigment layer 23. As a coating method, a known wet coating method such as gravure roll may be applied.

As a protective layer formed by a dry method (hereinafter, also referred to as "dry protective layer"), a layer formed from at least one inorganic material selected from the group consisting of an inorganic oxide, an inorganic nitride, and an inorganic oxynitride is preferable. A total content of at least one selected from the group consisting of an inorganic oxide, an inorganic nitride, and an inorganic oxynitride with respect to a total dry protective layer is preferably 90% by mass or more, more preferably 95% by mass or more, still more preferably 99% by mass or more, and particularly preferably 100% by mass.

Examples of the inorganic oxide include an oxide of at least one metal selected from the group consisting of aluminum, silicon, and magnesium, and silicon oxide ($SiO_x$, $0<x\leq2$) and aluminum oxide ($AlO_x$, $0<x\leq1.5$) are preferable.

Examples of the inorganic nitride include silicon nitride ($SiN_x$, $0<x\leq1.3$) and aluminum nitride ($AlN_x$, $0<x\leq1$).

Examples of the inorganic oxynitride include silicon nitride oxide ($SiO_xN_y$, $0<x<1$, $0<y<1$).

Specific formation conditions for a dry protective layer may be set according to methods and materials to be used.

For example, a layer composed of aluminum oxide is obtained by using an aluminum target and depositing a film by sputtering in an oxygen-containing atmosphere. In this process, by applying intermittent negative DC voltage to the target, arcing during deposition may be effectively suppressed, the power input may be increased, and a high deposition rate may be maintained for a long time. Specific sputtering conditions at this time vary depending on various conditions such as the type of equipment, a target composition and the like, and may be selected as appropriate. Typically, it is preferable to perform sputtering at a sputtering gas pressure of from 0.1 to 1.3 Pa and a power density of from 0.5 to 5 W/cm$^2$ after evacuating to $8\times10^{-4}$ Pa and introducing argon and oxygen in a flow ratio of from 0:100 to 90:10 into a container.

A dry protective layer may be composed of a single layer, or a plurality of layers of different materials. Examples of the latter protective layer include one composed of a plurality of layers with different types of inorganic materials as the main component.

A thickness of a dry protective layer (total thickness in a case in which composed of a plurality of layers) is preferably 10 nm or more from the viewpoint of abrasion resistance. From the viewpoint of maintaining the flexibility of the film 2 and ensuring adhesion, the thickness is preferably less than 100 nm, and particularly preferably 50 nm or less.

Examples of a protective layer formed by a wet method (hereinafter, referred to as "wet protective layer") include a layer composed of an inorganic compound (hereinafter, referred to as "wet inorganic protective layer") and a layer composed of an organic compound (hereinafter, referred to as "wet organic protective layer").

Examples of the wet inorganic protective layer include a silica layer, a silica-baemite layer, and a baemite layer. A thickness of a wet inorganic protective layer is, for example, from 0.1 to 2 μm.

As a wet organic protective layer, a layer formed from a fluororesin with a reactive functional group is preferable. A content ratio of a fluororesin with a reactive functional group to a total amount of a wet organic protective layer is preferably 90% by mass or more, more preferably 95% by mass or more, 99% by mass or more, and particularly preferably 100% by mass. Examples of the reactive functional group include a hydroxyl group and a carboxy group. In such a layer, a fluororesin may be cross-linked by reaction between reactive functional groups or reaction between a reactive functional group and a curing agent.

As a fluororesin with a reactive functional groups, a copolymer of one or more fluoroolefins and one or more other monomers that can copolymerize with a fluoroolefin is preferable.

As a fluororesin with a reactive functional group, a fluororesin with a hydroxyl group or a carboxy group is preferable, and a fluororesin with a hydroxyl group is especially preferable. Examples of such a fluoresin commercially available include LUMIFLON (registered trademark) series (LF200, LF100, LF710, and the like) (manufactured by AGC Corporation), ZEFFLE (registered trademark) GK series (GK-500, GK-510, GK-550, GK-570, GK-580, and the like) (manufactured by Daikin Industries, Ltd.), FLUONATE (registered trademark) series (K-700, K-702, K-703, K-704, K-705, K-707, and the like) (manufactured by DIC Corporation), ETERFLON series (4101, 41011, 4102, 41021, 4261A, 4262A, 42631, 4102A, 41041, 41111, 4261A, and the like) (manufactured by Eternal Chemical Corporation).

The wet organic protective layer may contain another component to an extent that an effect of the invention is not impaired. Examples of the other component include a curing catalyst, a non-fluororesin, an anti-blocking agent, and a known additive.

The thickness of a wet organic protective layer is, for example, from 0.3 to 3 μm.

A wet organic protective layer can be formed, for example, by adding a solvent such as toluene, xylene, methyl isobutyl ketone, or methyl ethyl ketone (hereinafter, also referred to as "MEK") to a fluororesin with a reactive functional group to adjust the viscosity to an appropriate level; adding a curing agent, an anti-blocking agent, and another component as needed to prepare a coating liquid; applying the coating liquid on or above the black pigment layer 23, and drying.

In a case in which a curing agent is used, the type and equivalent ratio are adjusted to optimize the flexibility of a cured film.

[Application]

The film in the present disclosure is suitable as a membrane structure film because the film has a dignified appearance, and is particularly suitable as a membrane structure film for the tension method.

A membrane structure film is used as a membrane material that constitutes a membrane structure. A membrane structure is an architectural structure in which at least part of a roof, an exterior wall, or the like is composed of a membrane material. Examples of the membrane structure include a sports facility (swimming pool, gymnasium, tennis court, soccer field, American football stadium, or the like), a warehouse, an assembly hall, an exhibition hall, a horticultural facility (gardening house, agricultural house, or the like), a shopping center, a parking lot, a bicycle parking lot, a zoo, and a livestock barn.

The film in the present disclosure may be used for not only a membrane structure film, but also for a screen, a sailboat canvas, a road sign, a release film, a label, a sticker, and the like.

A screen, for example, may be installed by itself in any location (outdoors, indoors, or the like, such as an open-air theater), or may constitute a membrane structure.

Application of a screen is not particularly limited, and examples of the application in a structure, such as an architectural structure, include the following. •Display of an image for interior decoration or commercial or educational purposes in a living space. •Display of advertisements by projecting from inside a building. •Display of information and advertisements at a car dealer. •Display of advertisements and films on a small triangular window or a fixed window of a building, or change of exterior design, especially display on the upper part of the window. •Applications for advertising displays, information notices, events, and the like, by using a screen as a glass door in a supermarket, a retail store, or a public building. •Display of growing information or the like as a structural material in a greenhouse or the like. •Applications as a glass wall that can be used to change the pattern of wallpaper. •A backboard for a stadium, a studio, or the like. •A partition in a bathroom of a hotel or the like. •An application as a switchable privacy screen by projecting or non-projecting at least one of an appropriate image and light. In particular, in a conference room, a hospital, a bank, a restaurant, or a public facility, when light is not projected, the other side can be seen clearly, thus improving security when the privacy filter is not in use. •Display of a letter, a sign, an image, and a moving image in an airport, a train station, a hospital, or a school. •Display of regional and sightseeing information in a religious facility such as a temple, a shrine, or a church. •Spatial presentation in a commercial facility. •Projection mapping. •Display of a letter, a sign, an image, and a moving image at a stadium. •Information and personalized image projection application at a kitchen. •A whiteboard. For example, it is used in schools and meeting rooms as a member that can be written and displayed. Also used in conjunction with a user interface. •Used in pair glass for heat-insulating glass and used as a refrigerator door in a supermarket or a convenience store.

Examples of the application for a screen table top, casing, or the like include the following uses. •A table top in a restaurant. •A counter in a sushi restaurant. •A desk (desktop), kitchen counter. •A partition of a tabletop. •A showcase in the basement of a department store. •A showcase in a boutique and a dressing room. •A vending machine. •A partition in a pachinko parlor. •A front glass of a pachinko machine table. When playing pachinko, the tabletop is transparent, allowing a player to play as usual. When a table is vacant and no one is sitting at the table, a glass front on the front may be used to advertise a store.

Examples of the application for a screen in a vehicle include the following applications.

In a railroad vehicle: •window glass behind the driver's seat (to prevent reflection of interior lighting during underground operation); •information display on the side window glass for a railroad car; •an advertising hanging; •a partition on a Shinkansen bullet train; •a window pane of a linear motor car; and •providing a screen function on a window of a train. In particular, when used after sunset, visibility is improved, which is desirable.

In an automobile or the like: •display on a shade part of a windshield; •information display on the lower part of a windshield of an automobile; •information and image display on a partition inside a cab, a limousine, or the like (on the driver's back) and an advertisement inside the bus; •sun visors for an automobile, •display of an image of TV or DVD as a partition in a minivan and a sport utility vehicle (SUV); •when a side door is opened, "Caution!" or the like is displayed on the door glass; mounted on a rear glass to display backlight, high-mounted stop lamp (HMSL), rearward information display, and destination display for a bus or the like; around meters; and screen for door glass.

Examples of the other application for a screen include an anti-glare glass, an anti-glare mirror, and a traffic light cover glass (integration of a variety of traffic light indications).

The disclosures of Japanese Patent Application No. 2020-112390 is incorporated herein by reference in their entirety.

All documents, patent applications, and technical standards described in the present specification are incorporated herein by reference to the same extent as if each individual document, patent application, or technical standard were specifically and individually indicated to be incorporated by reference.

EXAMPLES

Specific examples of the above-described embodiments are described below as Examples. The invention is not limited to the following Examples.

Examples 2 to 8, 10, 11, and 13 to 19 are Examples, and Examples 1, 9, 12, and 20 are Comparative Examples Measurement methods and evaluation methods used in each of the following examples are as follows.
[Evaluation Method]
(Optical Properties)
The haze value was measured in accordance with JIS K7136:2000 using a turbidimeter (product name "NDH-5000", manufactured by NIPPON DEN SHOKU INDUSTRIES CO., LTD.).

The visible light transmittance was measured using a UV-visible spectrophotometer (product name "UV-3600PC", manufactured by Shimadzu Corporation) in accordance with DIN EN 410:1998.

For a film with a black pigment layer and a film with both a black pigment layer and a protective layer, optical properties were measured in the direction of light incidence from the side opposite to the side where these layers were formed (ETFE side).
(Thickness of Film)
The thickness ($\mu$m) of a film was measured by a contact micrometer (product name "MDE-50MJ", manufactured by Mitutoyo Corporation).
(Thickness of Black Pigment Layer and Dry Protective Layer)
The thickness (nm) of a black pigment layer and a dry protective layer was calculated by optical fitting with WVASE32 (manufactured by J.A. Woollam Japan Co., Ltd.), using a spectroscopic ellipsometry system (product name "M-2000DI", manufactured by J.A. Woollam Japan Co., Ltd.).
(Thickness of Wet Protective Layer)
The thickness of a wet protective layer was calculated from the difference in mass per unit area before and after the wet protective layer was formed, and the specific gravity of the wet protective layer measured in advance.
(Dignity)
Two rectangular aluminum frames with one side measuring 15 cm×50 cm were prepared. Double-sided adhesive tape was applied to both frames, and 1 mm thick butyl rubber was fixed on the tape. A double-sided adhesive tape was then applied to the butyl rubber on one frame, a film was placed on the butyl rubber, and the other frame was placed in such a manner that the butyl rubber was in contact with the film side, and the four corners were tightened. In this manner, a test piece with the film sandwiched between the frames was prepared.

The test piece was placed outdoors, and an observer visually observed the test piece from a distance of 2 m from the test piece, and when the film of the test piece looked like 10 mm thick glass, it was determined to be "dignity" and when the film did not look like glass, it was determined to be "not dignity". In a case in which the film was a film with a layered structure (a film with a black pigment layer or a film with both a black pigment layer and a protective layer), the test piece was placed in such a manner that the side closer to the observer was the fluororesin layer side and the side farther from the observer was the black pigment layer or the protective layer side. In a case in which the film is a monolayer film (composed only of a fluororesin layer), there is no distinction between the front surface and the back surface of the test piece.

There were ten observers, and the number of people who determined the test piece to be "dignity" was counted. A case in which the number of observers who determined the test piece to be "dignity" was 7 or more was designated as "A" (acceptable), and a case in which the number of observers who determined the test piece to be "dignity" was 6 or less was designated as "C" (not acceptable).
(Adhesion and Abrasion Test)
Two tests, an adhesion test and an abrasion test, were conducted, and those that did not pass the adhesion test were designated C (not acceptable), those that passed the adhesion test but not the abrasion test were designated B (acceptable), and those that passed both tests were designated A (favorable).

The adhesion test was performed only for a film with only a black pigment layer or a film with both a black pigment layer and a protective layer. A film without such layers (composed only of a fluororesin layer) passed the test without an adhesion test, because there was no layer to be peeled off <Adhesion Test>

The adhesion test was a cross-cut adhesion test using SELLOTAPE (registered trademark). 100 squares of 1 mm square were created by a cutter on the black pigment layer only or on the black pigment layer and the protective layer of the film, and the adhesion test was performed using SELLOTAPE (registered trademark) (product name "CT-18", manufactured by Nichiban Corporation). A case in which one or more squares were peeled off out of 100 squares was considered to be failed, and a case in which no peeling was observed at all was considered to be passed.

<Abrasion Test>

In the abrasion test, an eraser was used. A load of 10 N was applied to the eraser and three round trips were made on each side of a film. The color change of the film was then visually observed and determined. The film was determined to be not acceptable when the color faded, and acceptable when the color remained the same.

(Weather Resistance Test)

A film was placed in an accelerated weather resistance test apparatus (Sunshine 300 manufactured by Suga Test Instruments Co., Ltd.) and exposed to 5,000 hours of exposure. Exposure conditions were set at a black panel temperature of 63° C. The surface directly exposed to the shower and light was the surface containing fluororesin for all samples. The visible light transmittance was measured after exposure, and the rate of increase relative to the visible light transmittance before exposure was calculated. The closer the rate of increase in visible light transmittance to 0%, the better the weather resistance. Those with a rate of increase in visible light transmittance exceeding 5% can be determined to have a large change in visible light transmittance.

Example 1

To ETFE (product name "Fluon ETFE 55AXP", manufactured by AGC Corporation, melting point 260° C.), copper phthalocyanine blue (product name "CHROMOFINE BLUE", manufactured by Dainichiseika Color & Chemicals Mfg. Co., Ltd.) and phenyl methyl silicone oil (product name "KF54", manufactured by Shin-Etsu Chemical Co., Ltd.) were blended to form a formulation. The amounts of copper phthalocyanine blue and phenyl methyl silicone oil blended were set such that respective concentrations in 100% by mass of the formulation were 0.021% by mass and 0.001% by mass, respectively.

The above-described formulation was then melt-kneaded using a twin-screw extruder (φ15 mm, L/D=45) manufactured by TECHNOVEL CORPORATION set at 320° C. to obtain pellets.

Next, a single screw extruder of 30 mm diameter (L/D=22, with a screw of 3.0 compression ratio) is fitted with a 250 mm wide T-die for film forming and heated to 320° C. The above-described pellets were fed into the single screw extruder, and the melt extruded from the film forming T-die was passed through a metal roll whose roll temperature was maintained at 150° C. by a thermo-cooling medium using a constant speed take-up device to obtain a 250 μm thick ETFE film (fluororesin layer). This ETFE film was used as a film of Example 1.

The obtained film showed a highly chromatic blue color. The mass of copper phthalocyanine blue per unit area of the film (fluororesin layer) was calculated to be 0.092 g/m$^2$, since the specific gravity of ETFE was 1.75 and the thickness of the ETFE film was 250 μm. The composition of the film materials and the like are shown in Table 1, and the optical properties and evaluation results of the film are shown in Table 2.

"φ" indicates the cylinder bore diameter. "L/D" indicates a value obtained by dividing the screw length L (m) by the screw diameter D (m). "Compression ratio" is a characteristic value of the screw shape calculated from the ratio of the groove depths of a screw material sharing portion and a screw metering portion.

Example 2

The 250 μm thick ETFE film obtained in Example 1 was placed in a sputtering apparatus (manufactured by Canon Tokki Corporation) and vacuumed down to about $6.7 \times 10^{-4}$ Pa, and then Ar gas was introduced into the 50 sccm chamber to 0.3 Pa. Plasma was then generated by applying a DC voltage at a power of 200 W. Chromium was used as a target, and by opening and closing a shutter and controlling the deposition time, a chromium thin film (black pigment layer) with a thickness of 8 nm was deposited on the ETFE film. The obtained layered body was used as a film of Example 2.

The obtained film showed a blue-black color with low chroma. The composition of the film materials and the like are shown in Table 1, and the optical properties and evaluation results of the film are shown in Table 2.

Example 3

12 g of a varnish (product name "LF200MEK", manufactured by AGC Corporation, solvent: MEK, solid content: 60% by mass) of a chlorotrifluoroethylene fluororesin with a hydroxyl group and 0.8 g of an isocyanate curing agent (product name "CORONATE 2096", manufactured by Tosoh Corporation, solid content: 90% by mass) were mixed, and then 12 g of a mixed solvent of toluene/MEK=50/50 (mass ratio) was added thereto to obtain a coating liquid with a No. 3 Zahn cup viscosity of 20 seconds.

This coating liquid was applied using a gravure roll on the chromium thin film of the layered body obtained in Example 2, and dried at 100° C. for 20 seconds to form a wet protective layer with a thickness of 1 μm in dry. The obtained layered body was used as a film of Example 3.

The obtained film exhibited slightly red interference fringes at a surface of the wet protective layer side, but the color tone when viewed from the ETFE side did not change before and after the wet protective layer was formed. The composition of the film materials and the like are shown in Table 1, and the optical properties and evaluation results of the film are shown in Table 2.

Example 4

A layered body was manufactured in the same manner as in Example 2, except that the thickness of the chromium thin film was changed to 4 nm, and this layered body was used as a film of Example 4. The composition of the film materials and the like are shown in Table 1, and the optical properties and evaluation results of the film are shown in Table 2.

Example 5

A wet protective layer was formed on the chromium thin film of the layered body obtained in Example 4 in the same manner as in Example 3, and the obtained layered body was used as a film of Example 5. The composition of the film materials and the like are shown in Table 1, and the optical properties and evaluation results of the film are shown in Table 2.

Example 6

An 8 nm thick indium thin film (black pigment layer) was deposited on an ETFE film in the same manner as in Example 2, except that the target was changed from chromium to indium. The obtained layered body was used as a film of Example 6.

Examples 7 to 11

To ETFE (product name "Fluon ETFE 55AXP", manufactured by AGC Corporation, melting point 260° C.), copper phthalocyanine blue (product name "CHROMOFINE BLUE", manufactured by Dainichiseika Color & Chemicals Mfg. Co., Ltd.), phenyl methyl silicone oil (product name "KF54", manufactured by Shin-Etsu Chemical Co., Ltd.), and carbon black (product name "DENKA BLACK GRANULAR", manufactured by Denka Company Limited) were blended to form a formulation. The amounts of copper phthalocyanine blue pigment and carbon black were set such that the concentration (% by mass) of each in 100% by mass of the formulation was the concentration (% by mass) shown in Table 1. The amount of phenyl methyl silicone oil was set to a concentration of 0.001% by mass in 100% by mass of the formulation.

Then, as in Example 1, the above-described formulation was pelletized using a twin-screw extruder and made into film using a single-screw extruder.

The films of Examples 7, 8, 10, and 11 all exhibited a blue color with low chroma. The film of Example 9 exhibited a black color. In Example 7, the mass of carbon black per unit area of film was calculated to be 0.017 g/m$^2$, since the specific gravity of ETFE was 1.75 and the thickness of the film was 250 μm. The mass of carbon black per unit area of other films is shown in Table 1. The composition of the film materials and the like are shown in Table 1, and the optical properties and evaluation results of the film are shown in Table 2.

Example 12

A film was obtained in the same manner as in Example 1, except that the amounts of copper phthalocyanine blue and phenyl methyl silicone oil were changed such that the respective concentrations in 100% by mass of the formulation were 0.24% by mass and 0.02% by mass, respectively.

The obtained film exhibited a dark blue color. The composition of the film materials and the like are shown in Table 1, and the optical properties and evaluation results of the film are shown in Table 2.

Example 13

To ETFE (product name "Fluon ETFE 55AXP", manufactured by AGC Corporation, melting point 260° C.), copper phthalocyanine green (product name "CHROMOFINE GREEN", manufactured by Dainichiseika Color & Chemicals Mfg. Co., Ltd.), phenyl methyl silicone oil (product name "KF54", manufactured by Shin-Etsu Chemical Co., Ltd.), and carbon black (product name "DENKA BLACK GRANULAR", manufactured by Denka Company Limited) were blended to form a formulation. The amounts of copper phthalocyanine green, phenyl methyl silicone oil, and carbon black were set such that the respective concentrations in 100% by mass of the formulation were 0.030% by mass, 0.001% by mass, and 0.0054% by mass, respectively.

Then, as in Example 1, the above-described formulation was pelletized using a twin-screw extruder and made into film using a single-screw extruder.

The obtained film exhibited a greenish-black color. The composition of the film materials and the like are shown in Table 1, and the optical properties and evaluation results of the film are shown in Table 2.

Example 14

A formulation was obtained in the same manner as in Example 13, except that carbon black was not blended.

Then, as in Example 1, the formulation was pelletized in a twin-screw extruder and made into film in a single-screw extruder. The obtained ETFE film exhibited a bright green color.

Then, an 8 nm thick chromium thin film was deposited on an ETFE film in the same manner as in Example 2, and the obtained layered body was used as a film of Example 14.

The obtained film exhibited a greenish-black color with low chroma. The composition of the film materials and the like are shown in Table 1, and the optical properties and evaluation results of the film are shown in Table 2.

Example 15

As in Example 14, an 8 nm thick chromium thin film was deposited on an ETFE film. Then, aluminum was used as a target, and 50 sccm of Ar gas and 3 sccm of $O_2$ gas were introduced into a chamber and discharged at a DC voltage of 320V. By opening and closing a shutter and controlling the deposition time, an aluminum oxide thin film (dry protective layer) with a thickness of 20 nm was deposited on the chromium thin film. The obtained layered body was used as a film of Example 15.

The composition of the film materials and the like are shown in Table 1, and the optical properties and evaluation results of the film are shown in Table 2.

Example 16

A wet protective layer was formed on the chromium thin film of the layered body obtained in Example 14 in the same manner as in Example 3, and the obtained layered body was used as a film of Example 16.

The composition of the film materials and the like are shown in Table 1, and the optical properties and evaluation results of the film are shown in Table 2.

Example 17

A layered body was manufactured in the same manner as in Example 14, except that the thickness of the chromium thin film was changed to 4 nm, and this layered body was used as a film of Example 17.

The obtained film exhibited a greenish-black color with low chroma. The composition of the film materials and the like are shown in Table 1, and the optical properties and evaluation results of the film are shown in Table 2.

Example 18

A 4 nm thick chromium thin film was deposited on the ETFE film in the same manner as in Example 17. Then, a 20 nm thick aluminum oxide thin film (dry protective layer) was deposited on the chromium thin film in the same manner as in Example 15. The obtained layered body was used as a film of Example 18.

The composition of the film materials and the like are shown in Table 1, and the optical properties and evaluation results of the film are shown in Table 2.

Example 19

To ETFE (product name "Fluon ETFE 55AXP", manufactured by AGC Corporation, melting point 260° C.), aluminum-cobalt composite oxide (product name "Co Blue P", manufactured by ASAHI KASEI KOGYO CO., LTD.), phenyl methyl silicone oil (product name "KF54", manufactured by Shin-Etsu Chemical Co., Ltd.), and carbon black (product name "DENKA BLACK GRANULAR", manufactured by Denka Company Limited) were blended to form a formulation. The amounts of aluminum-cobalt composite oxide, phenyl methyl silicone oil, and carbon black were set such that the respective concentrations in 100% by mass of the formulation were 0.060% by mass, 0.01% by mass, and 0.01% by mass, respectively. Then, as in Example 1, the above-described formulation was pelletized using a twin-screw extruder and made into film using a single-screw extruder.

The obtained film exhibited a blue-black color. The composition of the film materials and the like are shown in Table 1, and the optical properties and evaluation results of the film are shown in Table 2.

Example 20

A film was obtained in the same manner as in Example 19, except that the amount of aluminum-cobalt composite oxide was changed such that the concentration in 100% by mass of the formulation was 0.50% by mass.

The obtained film exhibited a blue-black color. The composition of the film materials and the like are shown in Table 1, and the optical properties and evaluation results of the film are shown in Table 2.

TABLE 1

| | Film structure | | | | | | | | | |
|---|---|---|---|---|---|---|---|---|---|---|
| | Fluororesin layer | | | | | | Black pigment layer | | Protective layer | |
| | Chromatic pigment | | | Black pigment | | | Thickness | | Thickness | |
| Example | Kind | Concentration (%) | Concentration (g/m$^2$) | Kind | Concentration (%) | Concentration (g/m$^2$) | Thickness (μm) | Material | Thickness (nm) | Material | Thickness (nm) |
| 1 | copper phthalocyanine blue | 0.021 | 0.092 | — | — | — | 250 | — | — | — | — |
| 2 | | | | — | — | — | | Cr | 8 | — | — |
| 3 | | | | — | — | — | | Cr | 8 | Fluororesin varnish | 1 |
| 4 | | | | — | — | — | | Cr | 4 | — | — |
| 5 | | | | — | — | — | | Cr | 4 | Fluororesin varnish | 1 |
| 6 | | | | — | — | — | | In | 8 | — | — |
| 7 | | | | CB | 0.00385 | 0.017 | | — | — | — | — |
| 8 | | | | CB | 0.00960 | 0.042 | | — | — | — | — |
| 9 | | | | CB | 0.05000 | 0.218 | | — | — | — | — |
| 10 | | | | CB | 0.02400 | 0.105 | | — | — | — | — |
| 11 | | | | CB | 0.00115 | 0.005 | | — | — | — | — |
| 12 | | 0.24 | 1.1 | — | — | — | | — | — | — | — |
| 13 | copper phthalocyanine green | 0.030 | 0.13 | CB | 0.0054 | 0.024 | | — | — | — | — |
| 14 | | | | — | — | — | | Cr | 8 | — | — |
| 15 | | | | — | — | — | | Cr | 8 | Aluminum oxide | 0.02 |
| 16 | | | | — | — | — | | Cr | 8 | Fluororesin varnish | 1 |
| 17 | | | | — | — | — | | Cr | 4 | — | — |
| 18 | | | | — | — | — | | Cr | 4 | Aluminum oxide | 0.02 |
| 19 | aluminum-cobalt composite oxide | 0.06 | 0.26 | CB | 0.01 | 0.044 | | — | — | — | — |
| 20 | | 0.5 | 2.2 | CB | 0.01 | 0.044 | | — | — | — | — |

TABLE 2

| | Optical Properties | | | Dignity | | Adhesion | Weather resistance test |
|---|---|---|---|---|---|---|---|
| Example | Visible light transmittance (%) | Haze value (%) | Color tone | Number of people | Judgement | and abrasion test | Rate of increase in visible light transmittance (%) |
| 1 | 57.9 | 12.3 | blue | 1 | C | A | 1.1 |
| 2 | 12.9 | 13.5 | blue-black | 10 | A | B | 2.0 |
| 3 | 15.2 | 14.0 | blue-black | 10 | A | A | 2.0 |
| 4 | 26.0 | 13.1 | blue-black | 8 | A | B | 3.4 |
| 5 | 29.7 | 13.7 | blue-black | 8 | A | A | 3.2 |
| 6 | 12.4 | 14.2 | blue-black | 10 | A | B | 7.8 |
| 7 | 53.5 | 12.6 | blue-black | 8 | A | A | 1.2 |
| 8 | 43.5 | 15.7 | blue-black | 8 | A | A | 1.2 |
| 9 | 1.1 | 87.8 | black | 2 | C | A | 1.2 |
| 10 | 6.5 | 24.5 | blue-black | 8 | A | A | 1.0 |
| 11 | 55.8 | 12.6 | blue-black | 7 | A | A | 1.2 |
| 12 | 17.4 | 36.5 | blue | 0 | C | A | 1.0 |
| 13 | 59.1 | 15.5 | greenish-black | 8 | A | A | 1.7 |
| 14 | 14.9 | 15.0 | greenish-black | 10 | A | B | 1.7 |
| 15 | 16.5 | 15.6 | greenish-black | 10 | A | A | 1.8 |
| 16 | 19.5 | 15.6 | greenish-black | 10 | A | A | 2.2 |
| 17 | 31.0 | 14.2 | greenish-black | 8 | A | B | 2.1 |
| 18 | 32.1 | 14.1 | greenish-black | 8 | A | A | 1.9 |
| 19 | 49.1 | 22.8 | blue-black | 7 | A | A | 0.2 |
| 20 | 38.5 | 70.9 | blue-black | 1 | C | A | 0.2 |

In Table 1, "Concentration (%)" indicates a content of a chromatic pigment or a black pigment (% by mass) in 100% by mass of a fluororesin layer. "Concentration (g/m²)" indicates a content of a chromatic pigment or a black pigment per unit area of a fluororesin layer.

"CB" denotes carbon black.

The films of Examples 2 to 8, 10, 11, and 13 to 19 had dignified appearance.

On the other hand, the film of Example 1 did not contain a black pigment, and thus did not have dignified appearance. This was considered because the film had a bright blue color tone and not a dark color.

The film of Example 9 had a visible light transmittance of less than 5% and haze value of more than 30%, which did not exhibit dignity.

The film of Example 12 did not contain a black pigment and had a haze value of more than 30%, thus did not exhibit dignity.

The film of Example 20 had a haze value of over 30% and therefore did not exhibit dignity.

Comparing Examples 2 and 3, Examples 4 and 5, Examples 14, 15 and 16, and Examples 17 and 18, it was confirmed that Examples 3, 5, 15, 16, and 18, having the protective layer, have excellent abrasion resistance while ensuring adhesion.

INDUSTRIAL APPLICABILITY

The film in the present disclosure has a dignified appearance like glass. Therefore, it is useful as a membrane structure film.

DESCRIPTION OF THE REFERENCE NUMERALS

1: Film, 2: Film, 2A: Film, 3: Fluororesin, 5: Chromatic Pigment, 7: Black Pigment, 10: Fluororesin Layer, 21: Fluororesin Layer, 23: Black Pigment Layer, 25: Protective Layer

The invention claimed is:
1. A film, comprising a fluororesin layer, comprising:
a fluororesin;
a chromatic pigment; and
a black pigment,
wherein a content of the black pigment per unit area of the fluororesin layer is from 0.003 to 0.150 g/m², and wherein a visible light transmittance of the film is from 5 to 60% and a haze value of the film is 30% or less.

2. The film according to claim 1, wherein the black pigment comprises at least one selected from the group consisting of carbon black, an interference aluminum pigment, iron oxide, titanium black, cobalt/iron/chromium composite oxide, copper/chromium/manganese composite oxide, iron/chromium composite oxide, and manganese/bismuth composite oxide.

3. A film, comprising:
a fluororesin layer comprising a fluororesin and a chromatic pigment;
a layer comprising a black pigment; and
a protective layer on or above the layer comprising the black pigment,
wherein the protective layer is a layer formed from a fluororesin with a reactive functional group, or a layer formed from at least one inorganic material selected from the group consisting of an inorganic oxide, an inorganic nitride, and an inorganic oxynitride, and
wherein a visible light transmittance of the film is from 5 to 60% and a haze value of the film is 30% or less.

4. The film according to claim 3, wherein a thickness of the layer comprising the black pigment is from 0.5 to 50 nm.

5. The film according to claim 3, wherein the layer containing the black pigment is a layer formed by a dry method.

6. The film according to claim 3, wherein the black pigment comprises at least one selected from the group consisting of a metal and an alloy.

7. The film according to claim 3, wherein the black pigment comprises at least one selected from the group consisting of chromium, a chromium alloy, nickel, a nickel alloy, titanium, a titanium alloy, zinc, a zinc alloy, indium and an indium alloy.

8. The film according to claim 1, wherein a content of the chromatic pigment per unit area of the fluororesin layer is from 0.030 to 0.80 g/m$^2$.

9. The film according to claim 1, wherein the chromatic pigment has a blue or green color tone.

10. The film according to claim 1, wherein the fluororesin comprises at least one selected from the group consisting of vinyl fluoride polymer, vinylidene fluoride polymer, vinylidene fluoride-hexafluoropropylene copolymer, tetrafluoroethylene-hexafluoropropylene-vinylidene fluoride copolymer, tetrafluoroethylene-propylene copolymer, tetrafluoroethylene-vinylidene fluoride-propylene copolymer, ethylene-tetrafluoroethylene copolymer, hexafluoropropylene-tetrafluoroethylene copolymer, ethylene-hexafluoropropylene-tetrafluoroethylene copolymer, perfluoro (alkyl vinyl ether)-tetrafluoroethylene copolymer, chlorotrifluoroethylene polymer, and ethylene-chlorotrifluoroethylene copolymer.

11. A membrane structure film, comprising the film according to claim 1.

12. A film, comprising:
a fluororesin;
a chromatic pigment; and
a black pigment,
wherein the fluororesin comprises at least one selected from the group consisting of vinyl fluoride polymer, vinylidene fluoride polymer, vinylidene fluoride-hexafluoropropylene copolymer, tetrafluoroethylene-hexafluoropropylene-vinylidene fluoride copolymer, tetrafluoroethylene-propylene copolymer, tetrafluoroethylene-vinylidene fluoride-propylene copolymer, ethylene-tetrafluoroethylene copolymer, hexafluoropropylene-tetrafluoroethylene copolymer, ethylene-hexafluoropropylene-tetrafluoroethylene copolymer, perfluoro (alkyl vinyl ether)-tetrafluoroethylene copolymer, chlorotrifluoroethylene polymer, and ethylene-chlorotrifluoroethylene copolymer,
wherein a visible light transmittance of the film is from 5 to 60% and a haze value of the film is 30% or less.

13. The film according to claim 12, comprising a fluororesin layer comprising the fluororesin, the chromatic pigment and the black pigment.

14. The film according to claim 12, comprising a fluororesin layer comprising the fluororesin and the chromatic pigment, and a layer comprising the black pigment.

15. The film according to claim 3, wherein the chromatic pigment has a blue or green color tone.

16. The film according to claim 3, wherein the fluororesin comprises at least one selected from the group consisting of vinyl fluoride polymer, vinylidene fluoride polymer, vinylidene fluoride-hexafluoropropylene copolymer, tetrafluoroethylene-hexafluoropropylene-vinylidene fluoride copolymer, tetrafluoroethylene-propylene copolymer, tetrafluoroethylene-vinylidene fluoride-propylene copolymer, ethylene-tetrafluoroethylene copolymer, hexafluoropropylene-tetrafluoroethylene copolymer, ethylene-hexafluoropropylene-tetrafluoroethylene copolymer, perfluoro (alkyl vinyl ether)-tetrafluoroethylene copolymer, chlorotrifluoroethylene polymer, and ethylene-chlorotrifluoroethylene copolymer.

17. A membrane structure film, comprising the film according to claim 3.

* * * * *